US011422200B2

(12) United States Patent
Liu et al.

(10) Patent No.: US 11,422,200 B2
(45) Date of Patent: Aug. 23, 2022

(54) CASCADE CONVERTER AND ONLINE MONITORING METHOD THEREOF

(71) Applicant: Delta Electronics, Inc., Taoyuan (TW)

(72) Inventors: Rufeng Liu, Taoyuan (TW); Daiping Zhou, Taoyuan (TW); Yongqiang Lang, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 37 days.

(21) Appl. No.: 16/734,150

(22) Filed: Jan. 3, 2020

(65) Prior Publication Data
US 2020/0241077 A1 Jul. 30, 2020

(30) Foreign Application Priority Data
Jan. 30, 2019 (CN) .......................... 201910092458.7

(51) Int. Cl.
*G01R 31/40* (2020.01)
*H02M 7/219* (2006.01)
(Continued)

(52) U.S. Cl.
CPC ......... *G01R 31/40* (2013.01); *G01R 27/2605* (2013.01); *H02M 1/00* (2013.01);
(Continued)

(58) Field of Classification Search
CPC ............. H02M 2001/007; H02M 1/14; H02M 2001/0074; H02M 5/458; H02M 7/217;
(Continued)

(56) References Cited

U.S. PATENT DOCUMENTS

RE37,126 E * 4/2001 Peng ....................... H02M 7/49
363/137
9,651,592 B2 * 5/2017 Kerkman ................ G01R 31/64
(Continued)

FOREIGN PATENT DOCUMENTS

CN 105158577 A 12/2015
CN 105337519 A 2/2016
(Continued)

OTHER PUBLICATIONS

Laadjal et al. Online Estimation of Aluminum Electrolytic-Capacitor Parameters Using a Modified Prony's Method, IEEE Transactions On Industry Applications, vol. 54, No. 5, Sep./Oct. 2018 (Year: 2018).*

(Continued)

*Primary Examiner* — Gustavo A Rosario-Benitez
(74) *Attorney, Agent, or Firm* — Kirton McConkie; Evan R. Witt

(57) ABSTRACT

A cascade converter and an online monitoring method are provided. The capacitor parameters of a bus capacitor of a cascade unit is acquired according to the voltage across the bus capacitor of the first target cascade unit, the cascade side current of the single-phase cascade module and a switching signal from the first target cascade unit. In such way, it is not necessary to increase the number of the current sensors. The capacitor parameters of the bus capacitor herein include the equivalent series resistance and the capacitance. Since the capacitor parameters of the bus capacitor are monitored constantly, the aging degree of the bus capacitor can be checked at any time.

18 Claims, 11 Drawing Sheets

(51) Int. Cl.
*H02M 1/00* (2006.01)
*H02M 7/49* (2007.01)
*G01R 27/26* (2006.01)

(52) U.S. Cl.
CPC .............. *H02M 7/219* (2013.01); *H02M 7/49* (2013.01); *H02M 1/0009* (2021.05)

(58) Field of Classification Search
CPC .......... H02M 7/219; H02M 7/25; H02M 7/19; H02M 7/49; H02M 7/497; H02M 7/483; H02M 2007/4835; G01R 31/40; G01R 27/26; G01R 27/2605
See application file for complete search history.

(56) References Cited

U.S. PATENT DOCUMENTS

| | | | |
|---|---|---|---|
| 2004/0133862 A1* | 7/2004 | Naruta | G06F 30/367 703/14 |
| 2010/0321038 A1* | 12/2010 | Dommaschk | H02M 7/483 324/658 |
| 2013/0208519 A1* | 8/2013 | Yamamoto | H02M 7/12 363/67 |
| 2014/0032145 A1* | 1/2014 | Yoo | G01R 27/2605 702/65 |
| 2014/0197774 A1 | 7/2014 | Liu et al. | |
| 2016/0313387 A1* | 10/2016 | Schweizer | G01R 31/64 |
| 2017/0005472 A1* | 1/2017 | Son | H02M 5/458 |
| 2017/0038418 A1* | 2/2017 | Lipnicki | G01R 31/42 |
| 2017/0322262 A1* | 11/2017 | Armstrong, II | G01R 31/389 |
| 2018/0156852 A1* | 6/2018 | Xia | G01R 27/2605 |
| 2018/0241239 A1* | 8/2018 | Frost | H02J 7/0019 |
| 2018/0340351 A1* | 11/2018 | Harkonen | G07C 9/00944 |
| 2020/0251982 A1* | 8/2020 | Foube | G01R 27/2605 |
| 2021/0099102 A1* | 4/2021 | Tahata | H02M 1/088 |

FOREIGN PATENT DOCUMENTS

| | | |
|---|---|---|
| CN | 105717368 A | 6/2016 |
| CN | 105891644 A | 8/2016 |
| CN | 106329976 A | 1/2017 |
| CN | 106464148 A | 2/2017 |
| CN | 107171583 A | 9/2017 |
| CN | 107342699 A | 11/2017 |
| CN | 109142880 A | 1/2019 |
| WO | 2013181763 A1 | 12/2013 |

OTHER PUBLICATIONS

Wang et al. Online Capacitance Estimation of Submodule Capacitors for Modular Multilevel Converter With Nearest Level Modulation, IEEE Transactions On Power Electronics, vol. 35, No. 7, Jul. 2020 (Year: 2020).*

Sun Pengju et al., An Online Monitoring Scheme of Equivalent Series Resistance for DC-Link Capacitor of High-Power AC Converter, Cin.Soc.for Elec.Eng., vol. 37 No. 17 Sep. 5, 2017.

Sun Fengyan et al., Research on failure prediction method of electrolytic capacitor used in power conversion circuit, Journal of Electronic Measurement and Instrument, Va. 24 No. 1, 2010.

\* cited by examiner

CASCADE CONVERTER AND ONLINE MONITORING METHOD THEREOF

CROSS-REFERENCE TO RELATED APPLICATION

This application claims priority to China Patent Application No. 201910092458.7, filed on Jan. 30, 2019, the entire contents of which are incorporated herein by reference for all purposes.

FIELD OF THE INVENTION

The present disclosure relates to a cascade converter, and more particularly to an online monitoring method and the related converter.

BACKGROUND OF THE INVENTION

A cascade converter is usually used for high-voltage applications. In case that the cascade converter malfunctions, a serious consequence occurs. Therefore, it is important to increase the reliability of the cascade converter. The failure of the cascade converter is usually caused by the main power component. An electrolytic capacitor is an important power component of the cascade converter. Compared with other power semiconductor devices, the electrolytic capacitor has shorter life and higher cost. Therefore, it is important to fully utilize the electrolytic capacitor and determine whether the electrolytic capacitor is ineffective immediately.

Generally, the electrolytic capacitor is expressed by capacitor parameters (e.g., the capacitance C and the equivalent series resistance ESR). It is determined whether the electrolytic capacitor has aged by estimating the above two parameters by most of the existing monitoring methods. During the operation of the electrolytic capacitor, the electrolyte in the capacitor gradually becomes thicker with the operating time. Consequently, the capacitance C of the electrolytic capacitor is gradually decreased, and the equivalent series resistance ESR is gradually increased. When the capacitance C is reduced to 80% of the default value or the equivalent series resistance ESR is increased to 2~3 times of the default value, the electrolytic capacitor is considered to be aged.

The conventional methods for monitoring the electrolytic capacitor are mainly classified into two categories, i.e., offline monitoring methods and online monitoring methods. The external hardware circuit and the test electrolytic capacitor are reorganized into a new recombined circuit by the offline monitoring method, and then a signal generator and a power amplifier are used to inject a signal into the recombined circuit. By detecting the current and the voltage of the electrolytic capacitor and analyzing the amplitude and the phase, the capacitance C of the electrolytic capacitor and the equivalent series resistance ESR can be calculated. It is easy to implement the offline monitoring method and the control system resources of the cascade converter are not occupied. However, since additional hardware circuits are required and the cascade converter has to be shut down, the monitoring result of the offline monitoring method cannot be constantly acquired.

For overcoming the drawbacks of the offline monitoring method, the online monitoring method has been disclosed. According to the online monitoring method, the voltage and the current of the electrolytic capacitor are detected, and the total output power and the total output current are acquired through simple mathematical calculations. After the voltage and the current are filtered and the voltage is divided by the current, the equivalent series resistance (ESR) is acquired. Although the online monitoring method is capable of monitoring the equivalent series resistance (ESR) of the electrolytic capacitor, there are still some drawbacks. For example, it is necessary to increase the number of the current sensors to monitor the current through the electrolytic capacitor. As the voltage level of the cascade converter increases, more current sensors are required and the monitoring cost increases. In addition, the inner structures of the cascade converter are adversely affected. That is, the applications of the cascade converter are limited.

Therefore, there is a need of providing an improved online monitoring method and the relating cascade converter so as to overcome the drawbacks of the conventional technologies.

SUMMARY OF THE INVENTION

In accordance with an aspect of the present disclosure, an online monitoring method for a cascade converter is provided. The cascade converter includes at least one single-phase cascade module, each single-phase cascade module comprises a plurality of cascade units, each cascade unit comprises an AC/DC conversion circuit and a bus capacitor connected in series, and AC sides of all AC/DC conversion circuits of each single-phase cascade module is connected in cascade to form a cascade side of the single-phase cascade module. The online monitoring method comprises the steps of: selecting one of the plurality of cascade units as a first target cascade unit, the first target cascade unit having a first bus capacitor, sampling a voltage across the first bus capacitor to obtain a first sampling voltage, calculating an amplitude and a phase of a first ripple voltage across the first bus capacitor at a twice switching frequency according to the first sampling voltage, sampling a cascade side current of the single-phase cascade module corresponding to the first target cascade unit, calculating a first current according to the sampled cascade side current and a switching signal from the AC/DC conversion circuit of the first target cascade unit, calculating an amplitude and a phase of a first ripple current flowing through the first bus capacitor at the twice switching frequency according to the first current, and acquiring a first equivalent series resistance and a capacitance value of the first bus capacitor according to the amplitude and the phase of the first ripple voltage and the amplitude and the phase of the first ripple current.

In accordance with another aspect of the present disclosure, a cascade converter is provided. The cascade converter includes a single-phase cascade module, a current sampling circuit, a voltage sampling circuit and a detecting circuit. The single-phase cascade module comprises a plurality of cascade units, each cascade unit comprises an AC/DC conversion circuit and a bus capacitor connected in series, and AC sides of all AC/DC conversion circuits of each single-phase cascade module are connected in cascade to form a cascade side of the single-phase cascade module. One of the plurality of cascade units of the single-phase cascade module is selected as a first target cascade unit, and the first target cascade unit has a first bus capacitor. The current sampling circuit is connected with the cascade side of the single-phase cascade module with the first target cascade unit, wherein a cascade side current of the single-phase cascade module is sampled by the current sampling circuit. The voltage sampling circuit is electrically connected with the first target cascade unit, wherein a voltage across the first bus capacitor is sampled by the voltage sampling circuit to obtain a first sampling voltage. The detecting circuit is electrically connected with the current sampling circuit and the voltage sampling circuit, wherein the detecting circuit calculates a first equivalent series resistance and a capacitance value of the first bus capacitor according to the cascade side current, the first sampling voltage and a switching signal from the AC/DC conversion circuit of the first target cascade unit.

The above contents of the present disclosure will become more readily apparent to those ordinarily skilled in the art after reviewing the following detailed description and accompanying drawings, in which:

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1:
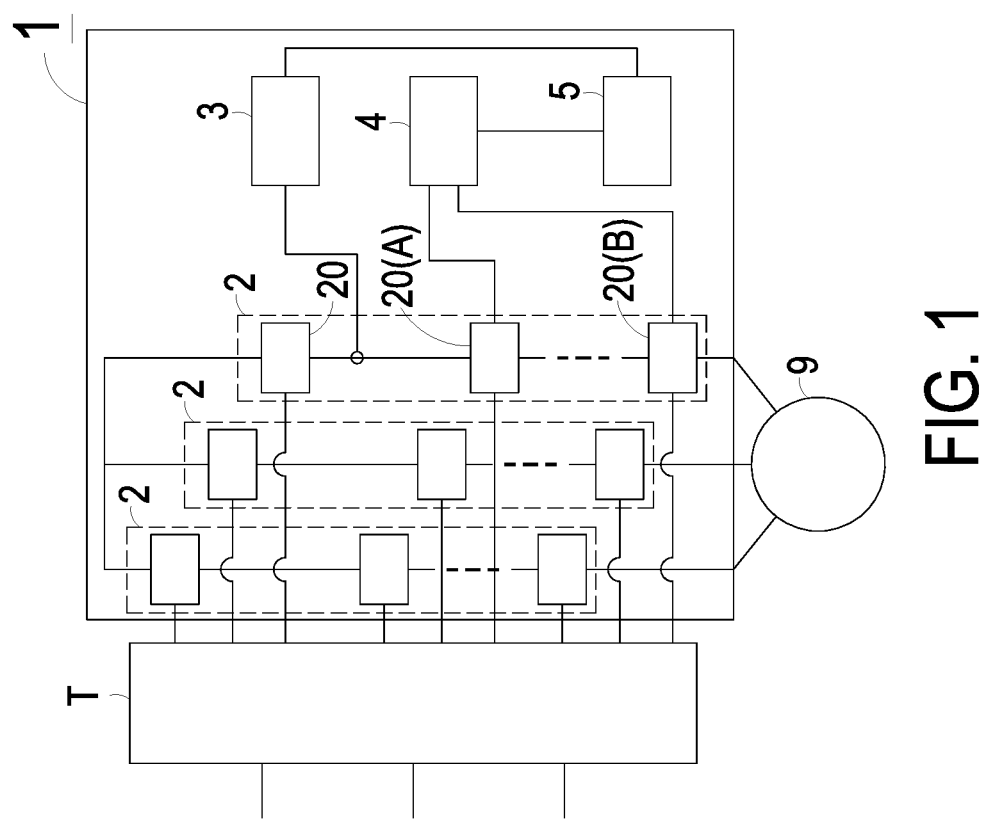
FIG. 1 is a schematic circuit diagram illustrating a cascade converter according to a first embodiment of the present disclosure.
Figure 2:
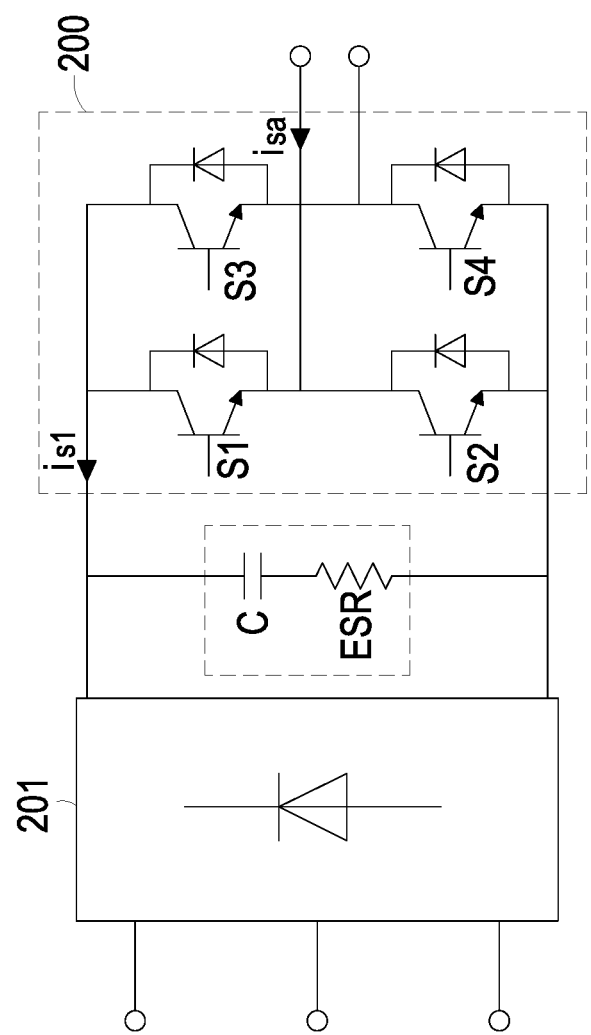
FIG. 2 is a schematic circuit diagram illustrating a cascade unit of the cascade converter according to the first embodiment of the present disclosure.

Please refer to FIGS. 1 and 2. FIG. 1 is a schematic circuit diagram illustrating a cascade converter according to a first embodiment of the present disclosure. FIG. 2 is a schematic circuit diagram illustrating a cascade unit of the cascade converter according to the first embodiment of the present disclosure. As shown in FIGS. 1 and 2, the cascade converter 1 includes at least one single-phase cascade module 2, a current sampling circuit 3, a voltage sampling circuit 4 and a detecting circuit 5. The number of the at least one single-phase cascade module 2 is determined according to the phase number of an AC power to be transmitted by the cascade converter 1. For example, as shown in FIG. 1, the load 9 is a three-phase load. Under this circumstance, the cascade converter 1 includes three single-phase cascade modules 2. The single-phase cascade module 2 includes a plurality of serially-connected cascade units 20. Each cascade unit 20 includes an AC/DC conversion circuit 200 and a bus capacitor $C_{bus}$, which are connected with each other in series. According to a corresponding switching signal, the conversion between AC power and DC power is realized by the AC/DC conversion circuit 200. Preferably but not exclusively, the bus capacitor $C_{bus}$ is an electrolytic capacitor. The AC sides of the AC/DC conversion circuits 200 of each single-phase cascade module 2 are connected in cascade to form a cascade side of the single-phase cascade module 2. The cascade side of the single-phase cascade module 2 is connected with the load 9. In the single-phase cascade module 2, one of the plurality of cascade units 20 is a target cascade unit. As shown in FIG. 1, the cascade unit A is a first target cascade unit. The first target cascade unit A has a first bus capacitor $C_{bus}$. The capacitor parameters of the first bus capacitor $C_{bus}$ of the first target cascade unit A can be monitored by the online monitoring method of the present disclosure.

The current sampling circuit 3 is connected with the cascade side of the single-phase cascade module 2 with the first target cascade unit A. The current sampling circuit 3 is used for sampling a cascade side current $i_{sa}$ from the single-phase cascade module 2 with the first target cascade unit A. That is, the current sampling circuit 3 samples the AC side current through the AC/DC conversion circuit 200 of each cascade unit 20 of the single-phase cascade module 2.

The voltage sampling circuit 4 is electrically connected with the first target cascade unit A. The voltage sampling circuit 4 is used for sampling the voltage across the first bus capacitor $C_{bus}$ of the first target cascade unit A.

The detecting circuit 5 is electrically connected with the current sampling circuit 3 and the voltage sampling circuit 4. According to the cascade side current sampled by the current sampling circuit 3, the voltage across the first bus capacitor $C_{bus}$ of the first target cascade unit A sampled by the voltage sampling circuit 4 and the switching signal from the AC/DC conversion circuit 200 of the first target cascade unit A, the detecting circuit 5 calculates the capacitance of the first bus capacitor $C_{bus}$ of the first target cascade unit A.

In some embodiments, the cascade converter 1 further includes a control circuit. The control circuit is electrically connected with the current sampling circuit 3 and the voltage sampling circuit 4. In addition, the control circuit sends the switching signal to the AC/DC conversion circuit 200. Preferably but not exclusively, the detecting circuit 5 is integrated into the control circuit.

Similarly, the online monitoring method of the present disclosure can be used to monitor the capacitance of the bus capacitor $C_{bus}$ of any other target cascade unit. As shown in FIG. 1, the cascade unit B is a second target cascade unit. The second target cascade unit B has a second bus capacitor $C_{bus}$. The capacitor parameters of the second bus capacitor $C_{bus}$ of the second target cascade unit B can be monitored by the online monitoring method of the present disclosure. The voltage sampling circuit 4 is electrically connected with the second target cascade unit B for sampling the voltage across the second bus capacitor $C_{bus}$ of the second target cascade unit B. According to the cascade side current sampled by the current sampling circuit 3, the voltage across the second bus capacitor $C_{bus}$ of the second target cascade unit B sampled by the voltage sampling circuit 4 and the switching signal from the AC/DC conversion circuit 200 of the second target cascade unit B, the detecting circuit 5 calculates the capacitance of the second bus capacitor $C_{bus}$ of the second target cascade unit B. The capacitor parameters of other target cascade units can also be acquired by using the method.

Figure 3:
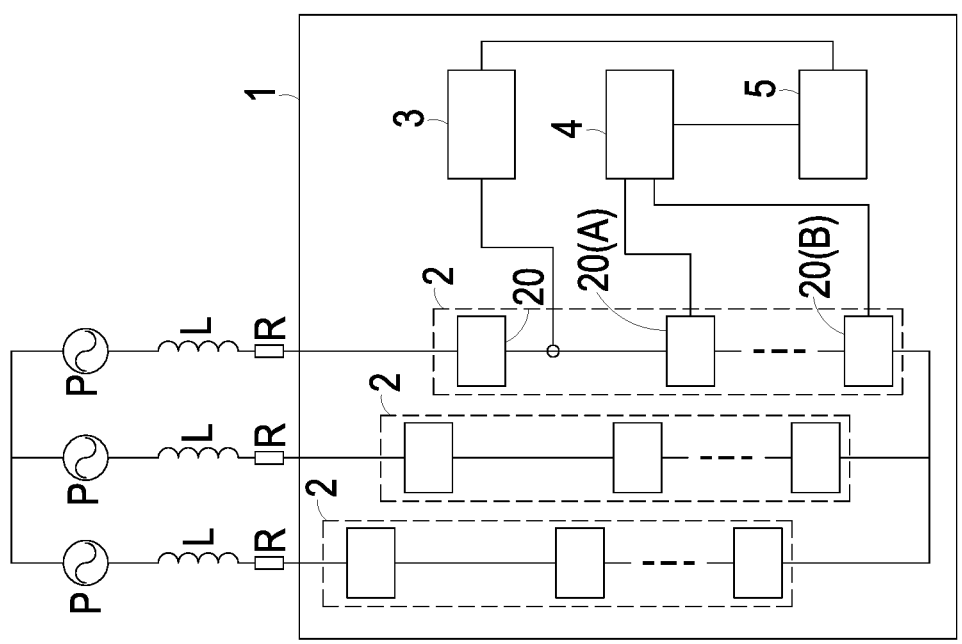
FIG. 3 is a schematic circuit diagram illustrating a cascade converter according to a second embodiment of the present disclosure.
Figure 5:
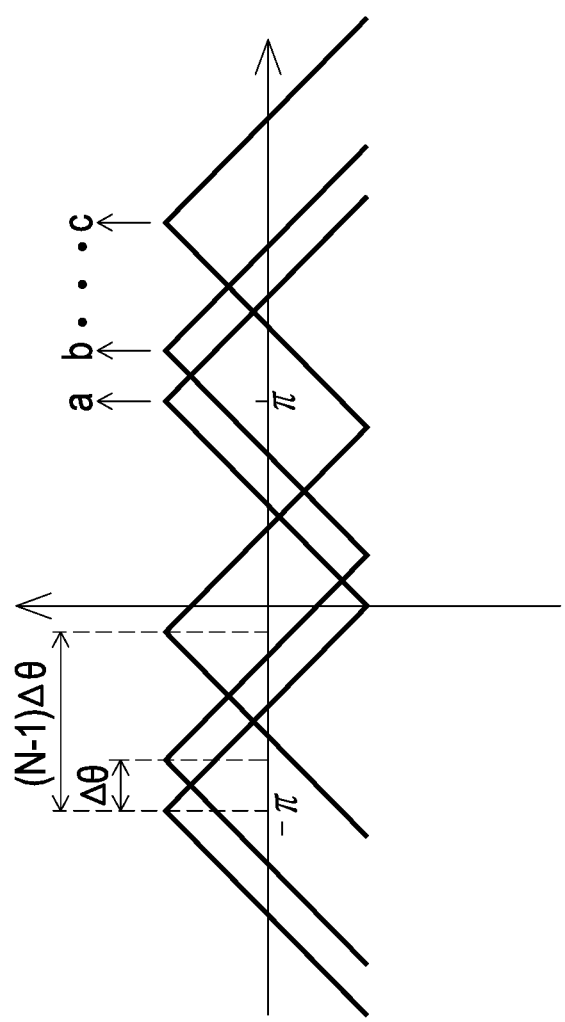
FIG. 5 schematically illustrates the relationships between the carrier phases of the plurality of cascade units of the single-phase cascade module as shown in FIG. 1 or FIG. 3.

In an embodiment, the cascade converter 1 is operated according to a carrier phase shifting modulation. Preferably, the cascade converter 1 is operated according to a carrier phase shifting sine pulse width modulation. FIG. 5 schematically illustrates the relationships between the carrier phases of the plurality of cascade units of the single-phase cascade module as shown in FIG. 1 or FIG. 3. As shown in FIG. 5, there is a phase difference between every two adjacent cascade units of the plurality of cascade units 20 (e.g., N cascade units) of the single-phase cascade module 2. In FIG. 5, the carrier of the first cascade unit 20 of the single-phase cascade module 2 is indicated as the curve a, the carrier of the second cascade unit 20 of the single-phase cascade module 2 is indicated as the curve b, and the carrier of the N-th cascade unit 20 of the single-phase cascade module 2 is indicated as the curve c. The carrier phase difference between every two adjacent cascade units 20 of the phase cascade module 2 is Δθ. Consequently, the carrier phase difference between the first cascade unit 20 and the N-th cascade unit 20 is equal to (N−1)Δθ. According to the sampled cascade side current $i_{sa}$, the sampled voltage across the second bus capacitor $C_{bus}$ of the second target cascade unit B and the carrier phase difference between the second target cascade unit B and the first target cascade unit A, the detecting circuit 5 calculates the capacitance of the second bus capacitor $C_{bus}$ of the second target cascade unit B.

In an embodiment, each AC/DC conversion circuit 200 is a H-bridge switching circuit. The H-bridge switching circuit includes a first bridge arm and a second bridge arm. The first bridge arm includes a first switch S1 and a second switch S2, which are connected in series. The second bridge arm includes a third switch S3 and a fourth switch S4, which are connected in series. The on/off states of the two switches of each bridge arm are complementary. Consequently, the detecting circuit 5 receives the switching signals from the upper arms of the first bridge arm and the second bridge arm (i.e., a first switching signal and a second switching signal). In another embodiment, each AC/DC conversion circuit 200 is a half-bridge switching circuit or any other appropriate bridge switching circuit, and the detecting circuit 5 receives the corresponding switching signal.

In the embodiment of FIG. 1, the cascade converter 1 is a high-voltage variable-frequency converter. All cascade units 20 of the cascade converter 1 are electrically connected with a transformer T. The transformer T is electrically connected with an input power source to achieve the power conversion between the input power source and the load 9.

Please refer to FIG. 2 again. Each cascade unit 20 further includes a rectifier circuit 201. The rectifier circuit 201 is serially connected between the transformer T and the bus capacitor $C_{bus}$. In the embodiment of FIG. 2, the rectifier circuit 201 is a three-phase full-bridge rectifier circuit. In some other embodiments, the rectifier circuit 201 is a single-phase full-bridge rectifier circuit. The type of the rectifier circuit 201 is determined according to the type of the transformer T. It is noted that the cascade converter 1 is not restricted to the high-voltage variable-frequency converter.

Figure 4:
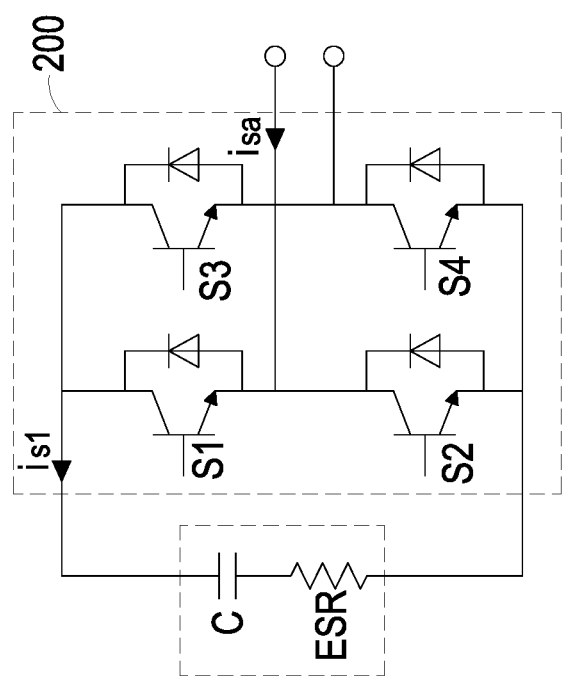
FIG. 4 is a schematic circuit diagram illustrating a cascade unit of the cascade converter according to the second embodiment of the present disclosure.

Please refer to FIGS. 3 and 4. FIG. 3 is a schematic circuit diagram illustrating a cascade converter according to a second embodiment of the present disclosure. FIG. 4 is a schematic circuit diagram illustrating a cascade unit of the cascade converter according to the second embodiment of the present disclosure. In other embodiments, the cascade converter 1 is used as a front-stage topology of a power electronic transformer. As shown in FIG. 3, the AC sides of the AC/DC conversion circuits 200 of each single-phase cascade module 2 are connected in cascade to form a cascade side of the single-phase cascade module 2. Each cascade side is electrically connected with a single-phase power source P, an inductor L and an equivalent resistance R. In comparison with the architecture of the cascade unit 20 as shown in FIG. 2, the cascade unit 20 as shown in FIG. 4 is not equipped with the rectifier circuit. Elements corresponding to those of the first embodiment are designated by identical numeral references, and detailed descriptions thereof are omitted.

Figure 6:
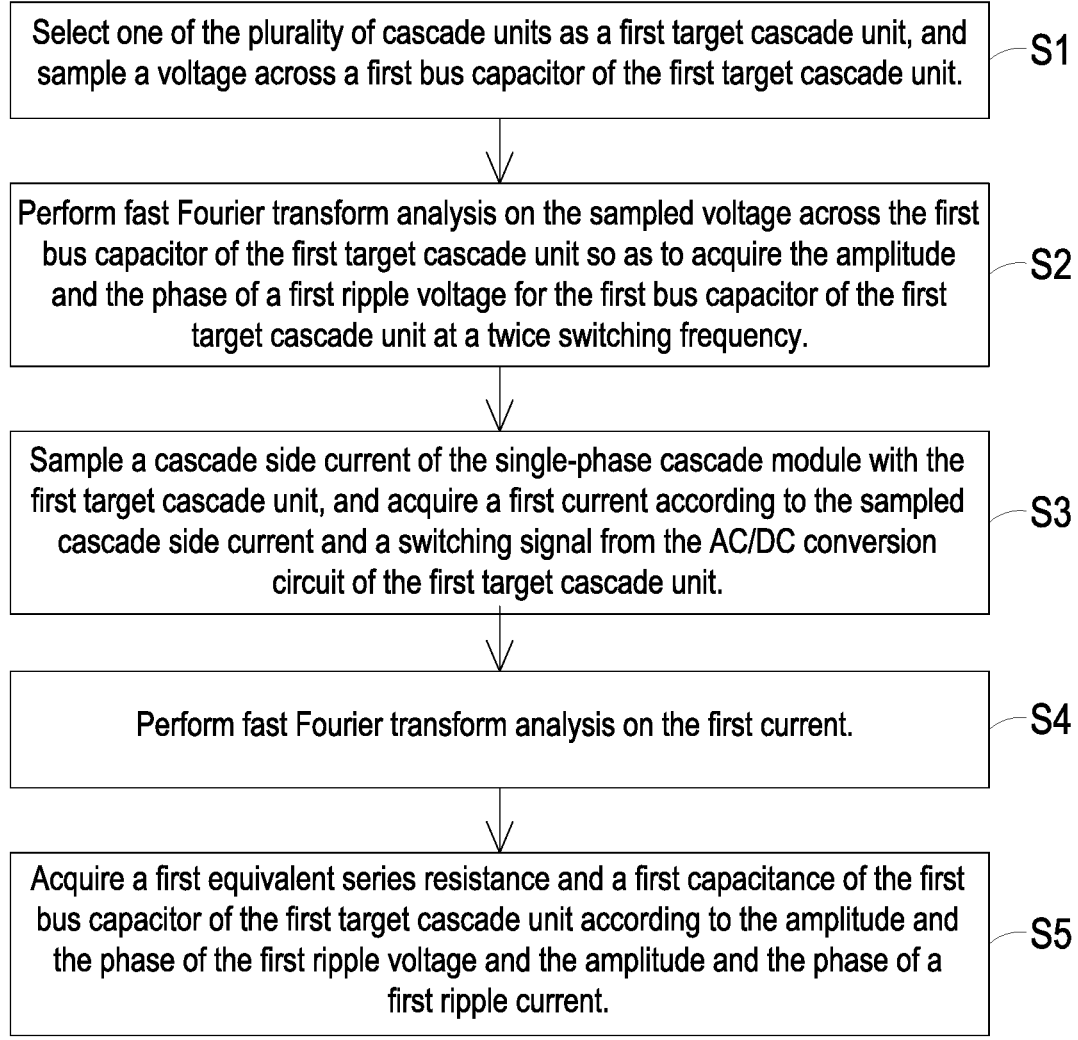
FIG. 6 schematically illustrates a flowchart of an online monitoring method for a cascade converter according to a first embodiment of the present disclosure.

Please refer to FIGS. 1, 2, 3, 4 and 6. FIG. 6 schematically illustrates a flowchart of an online monitoring method for a cascade converter according to a first embodiment of the present disclosure. The online monitoring method can be applied to the cascade converter 1 of FIG. 1 or FIG. 3.

The impedance X1(s) of the first bus capacitor $C_{bus}$ of the first target cascade unit A may be expressed by the following formula:

$$X1(s) = \frac{\dot{U}_{dc\text{-}sfl}}{\dot{I}_{c\text{-}sfl}} = \frac{U_{dc\text{-}sfl} \angle \alpha_1}{I_{c\text{-}sfl} \angle \varphi_1} = \frac{1}{sC_1} + ESR_1 \qquad (a)$$

In the above mathematic formula, s is the parameter for Laplace transform, $C_1$ is the capacitance of the first bus capacitor $C_{bus}$ of the first target cascade unit A, $ESR_1$ is an equivalent series resistance of the first bus capacitor $C_{bus}$ of the first target cascade unit A, $\dot{U}_{dc\text{-}sfl}$ is a voltage across two terminals of the first bus capacitor $C_{bus}$ of the first target cascade unit A at the frequency of $2f_s$ (also referred as a twice switching frequency), $U_{dc\text{-}sfl}$ is the amplitude of the voltage $\dot{U}_{dc\text{-}sfl}$, $\alpha_1$ is the phase of the voltage $\dot{U}_{dc\text{-}sfl}$, $\dot{I}_{c\text{-}sfl}$ is a current flowing through the first bus capacitor $C_{bus}$ of the first target cascade unit A at the frequency of $2f_s$, $I_{c\text{-}sfl}$ is the amplitude of the current $\dot{I}_{c\text{-}sfl}$, $\varphi_1$ is the phase of the current $\dot{I}_{c\text{-}sfl}$, and $f_s$ is a switching frequency of the AC/DC conversion circuit 200 of the first target cascade unit A.

As shown in FIG. 2 or FIG. 4, the AC/DC conversion circuit 200 is an H-bridge switching circuit. The AC side current and the DC side current of the H-bridge switching circuit are $i_{sa}$ and $i_{s1}$, respectively. While the switches S1~S4 operates, the AC side current $i_{sa}$ (i.e., the cascade side current $i_{sa}$ from the single-phase cascade module 2 with the first target cascade unit A) and the DC side current $i_{s1}$ satisfy the following mathematic formula:

$$i_{s1} = (S_a - S_b) * i_{sa} \qquad (b)$$

In the above mathematic formula, $S_a$ is a first switching signal of the H-bridge switching circuit, and $S_b$ is a second switching signal of the H-bridge switching circuit. If $S_a=1$, the first switch S1 is turned on and the second switch S2 is turned off. If $S_a=0$, the first switch S1 is turned off and the second switch S2 is turned on. If $S_b=1$, the third switch S3 is turned on and the fourth switch S4 is turned off. If $S_b=0$, the third switch S3 is turned off and the fourth switch S4 is turned on. In case that the AC/DC conversion circuit 200 is a half-bridge switching circuit or any other appropriate bridge switching circuit, the DC side current may be acquired according to the cascade side current and the switching signal.

As shown in FIG. 2 or FIG. 4, the ripple current $\dot{I}_{c\text{-}sfl}$ flowing through the bus capacitor $C_{bus}$ at the frequency of $2f_s$ is completely provided from the ripple current $\dot{I}_{sfl}$ in the DC side current $i_{s1}$ at the frequency of $2f_s$. The relationship between the two ripple currents satisfies the following mathematic formula:

$$\dot{I}_{sf1} = \dot{I}_{c-sf1} \qquad (c)$$

As can be seen from the formula (a), the voltage $\dot{U}_{dc-sf1}$ and the current $\dot{I}_{c-sf1}$ need to be calculated before the capacitor parameters of the bus capacitor $C_{bus}$ (i.e., the capacitance C1 and the equivalent series resistance ESR) are calculated. In other words, the online monitoring method of present disclosure obtains the capacitance C1 and the equivalent series resistance ESR of the bus capacitor $C_{bus}$ by using the formulae (a), (b) and (c).

The online monitoring method will be illustrated with reference to FIG. 6.

Firstly, in a step S1, one of the plurality of cascade units 20 is selected as a first target cascade unit A, and a voltage across a first bus capacitor $C_{bus}$ of the first target cascade unit A is sampled. In an embodiment, the voltage across the first bus capacitor $C_{bus}$ of the first target cascade unit A is sampled by the voltage sampling circuit 4.

In a step S2, fast Fourier transform analysis is performed on the sampled voltage across the first bus capacitor $C_{bus}$ of the first target cascade unit A. Consequently, the amplitude and the phase of a first ripple voltage $\dot{U}_{dc-sf1}$ for the first bus capacitor $C_{bus}$ of the first target cascade unit A at the twice switching frequency are acquired. In an embodiment, the fast Fourier transform analysis is performed on the sampled voltage across the first bus capacitor $C_{bus}$ of the first target cascade unit A by the detecting circuit 5.

In a step S3, a cascade side current $i_{sa}$ of the single-phase cascade module 2 with the first target cascade unit A is sampled, and a first current (i.e., the DC side current $i_{s1}$ of the AC/DC conversion circuit 200 of the first target cascade unit A) is acquired according to the sampled cascade side current $i_{sa}$ and a switching signal from the AC/DC conversion circuit 200 of the first target cascade unit A by the detecting circuit 5. In an embodiment, the cascade side current $i_{sa}$ of the single-phase cascade module 2 with the first target cascade unit A is sampled by the current sampling circuit 3.

In a step S4, fast Fourier transform analysis is performed on the first current. Consequently, the amplitude and the phase of a ripple current $\dot{I}_{sf1}$ flowing through the first bus capacitor $C_{bus}$ of the first target cascade unit A at the twice switching frequency ($2f_s$) are acquired. According to the formula (c), the ripple current $\dot{I}_{sf1}$ in the first current $i_{s1}$ at the twice switching frequency ($2f_s$) is equal to the first ripple current $\dot{I}_{c-sf1}$ flowing through the bus capacitor $C_{bus}$ at the twice switching frequency ($2f_s$). In an embodiment, the fast Fourier transform analysis is performed on the first current by the detecting circuit 5.

In a step S5, a first equivalent series resistance and a first capacitance of the first bus capacitor $C_{bus}$ of the first target cascade unit A are acquired according to the amplitude and the phase of the first ripple voltage and the amplitude and the phase of the first ripple current. In an embodiment, the first equivalent series resistance and the first capacitance of the first bus capacitor $C_{bus}$ of the first target cascade unit A are acquired by the detecting circuit 5 according to the formula (a).

It is noted that numerous modifications and alterations may be made while retaining the teachings of the disclosure. For example, through the fast Fourier transform analysis in the step S2 or the step S4, the high-frequency ripper components in the voltage and the current of the first bus capacitor $C_{bus}$ of the first target cascade unit A at other frequency may be acquired and the capacitance of the bus capacitor $C_{bus}$ may be calculated according to the impedance relationship. The operating principles are similar to those of FIG. 6, and are not redundantly described herein.

From the above descriptions, the online monitoring method of the present disclosure is capable of acquiring the capacitor parameters of the first bus capacitor $C_{bus}$ of the first target cascade unit A by sampling the voltage across the first bus capacitor $C_{bus}$ of the first target cascade unit A and the cascade side current $i_{sa}$ of the single-phase cascade module 2 with the first target cascade unit A. In such way, it is not necessary to increase the number of the current sensors. The capacitor parameters of the bus capacitor $C_{bus}$ include the equivalent series resistance ESR and the capacitance C. Since the capacitor parameters of the bus capacitor $C_{bus}$ are monitored constantly, the aging degree of the bus capacitor $C_{bus}$ can be checked at any time according to the first equivalent series resistance and the first capacitance. Since the malfunction caused by aging of the bus capacitor is prevented, the reliability of the cascade converter 1 is enhanced.

Figure 7:
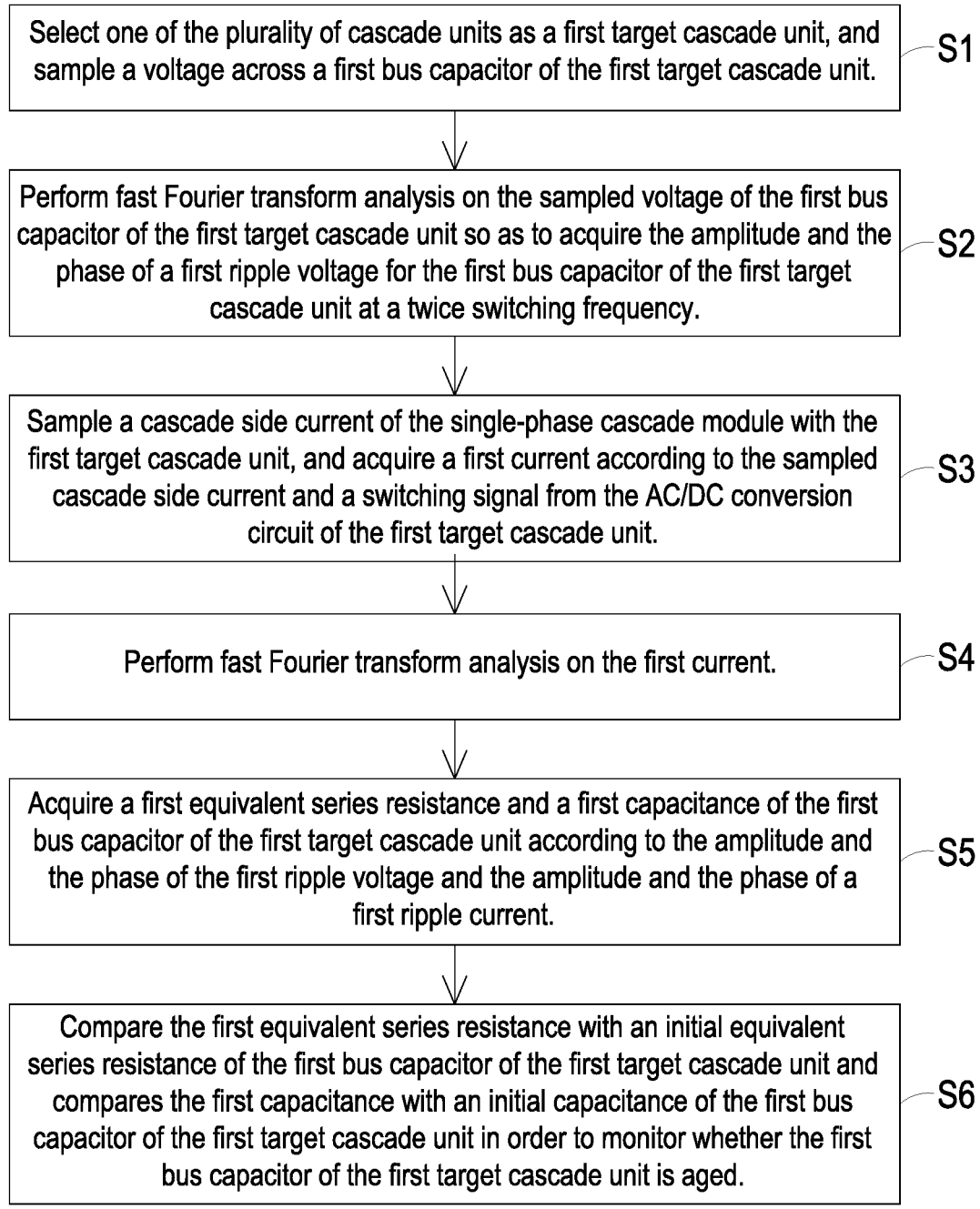
FIG. 7 schematically illustrates a flowchart of an online monitoring method for a cascade converter according to a second embodiment of the present disclosure.

FIG. 7 schematically illustrates a flowchart of an online monitoring method for a cascade converter according to a second embodiment of the present disclosure. The online monitoring method can be applied to the cascade converter of FIG. 1 or FIG. 3. In this embodiment, the online monitoring method includes steps S1~S6. The steps S1~S5 are the same as that of the first embodiment as shown in FIG. 6, and are not redundantly described herein. After the step S5, the step S6 is performed. In the step S6, the detecting circuit 5 compares the first equivalent series resistance with an initial equivalent series resistance of the first bus capacitor $C_{bus}$ of the first target cascade unit A and compares the first capacitance with an initial capacitance of the first bus capacitor $C_{bus}$ of the first target cascade unit A in order to monitor whether the first bus capacitor $C_{bus}$ of the first target cascade unit A is aged.

Figure 8A:
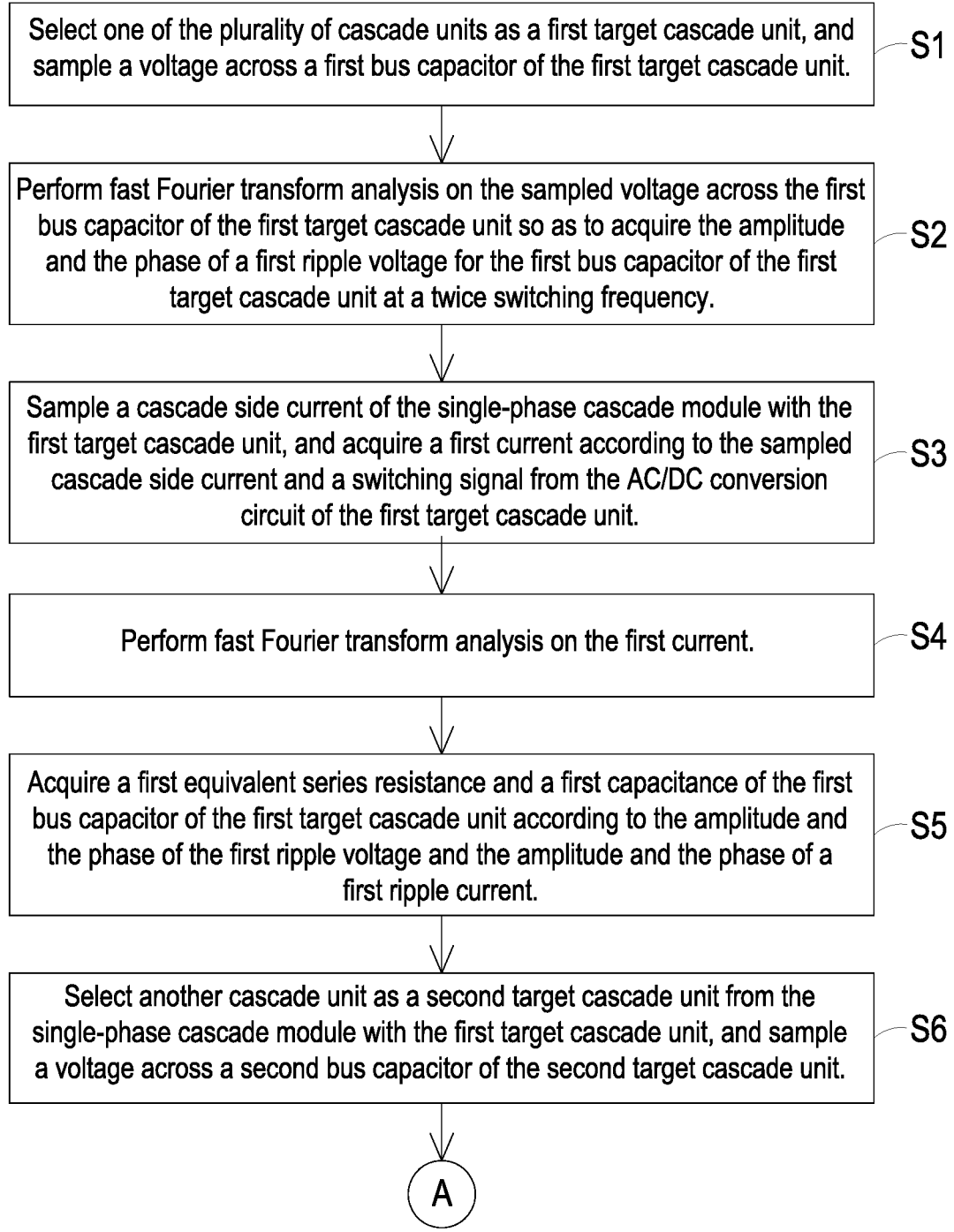
FIGS. 8A and 8B illustrate a flowchart of an online monitoring method for a cascade converter according to a third embodiment of the present disclosure.
Figure 8B:
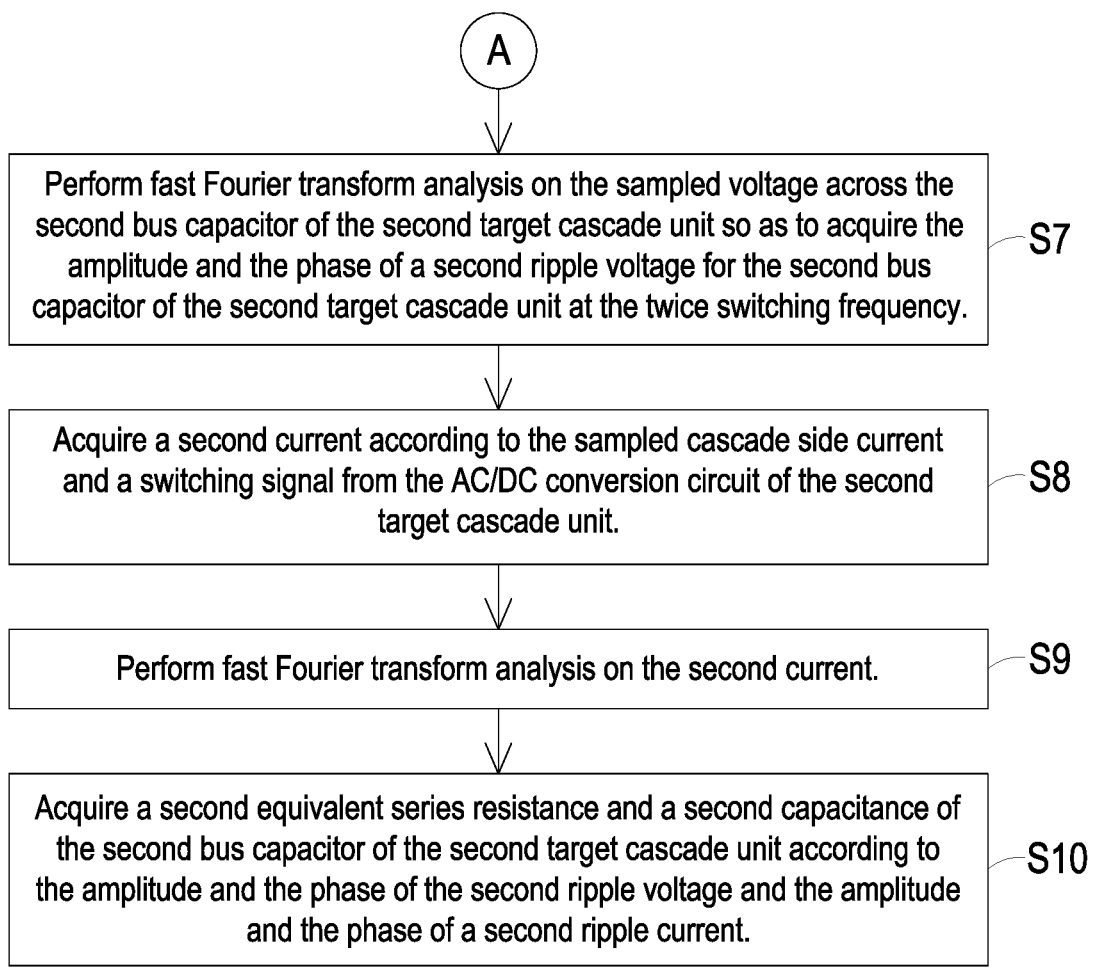

Please refer to FIGS. 1, 2, 3, 4, 8A and 8B. FIGS. 8A and 8B illustrate a flowchart of an online monitoring method for a cascade converter according to a third embodiment of the present disclosure. The online monitoring method can be applied to the cascade converter of FIG. 1 or FIG. 3. In this embodiment, the equivalent series resistances ESR and the capacitances C of the other target cascade units may be acquired according to the method of acquiring the first equivalent series resistance ESR and the first capacitance C of the first bus capacitor $C_{bus}$ of the first target cascade unit A as described in FIG. 6. In this embodiment, the online monitoring method includes steps S1~S10. The steps S1~S5 are the same as that of the first embodiment as shown in FIG. 6, and are not redundantly described herein. After the step S5, the step S6 is performed.

In the step S6, another cascade unit 20 is selected as a second target cascade unit B from the single-phase cascade module 2 with the first target cascade unit A, and a voltage across a second bus capacitor $C_{bus}$ of the second target cascade unit B is sampled.

In the step S7, fast Fourier transform analysis is performed on the sampled voltage across the second bus capacitor $C_{bus}$ of the second target cascade unit B. Consequently, the amplitude and the phase of a second ripple voltage across the second bus capacitor $C_{bus}$ of the second target cascade unit B at the twice second switching frequency are acquired. The second switching frequency refers to the frequency at which the second target cascade unit B operates. The second switching frequency and the first switching frequency at which the first target cascade unit A operates may be the same or different. In the step S8, a second current is acquired according to the sampled cascade side current $i_{sa}$ and a switching signal from the AC/DC conversion circuit 200 of the second target cascade unit B.

In a step S9, fast Fourier transform analysis is performed on the second current. Consequently, the amplitude and the phase of a second ripple current flowing through the second bus capacitor $C_{bus}$ of the second target cascade unit B at the twice second switching frequency are acquired.

In a step S10, a second equivalent series resistance and a second capacitance of the second bus capacitor $C_{bus}$ of the second target cascade unit B are acquired according to the amplitude and the phase of the second ripple voltage and the amplitude and the phase of the second ripple current.

As mentioned above, the steps S1~S5 are performed by the current sampling circuit 3, the voltage sampling circuit 4 and the detecting circuit 5. Similarly, the steps S6~S10 are performed by the current sampling circuit 3, the voltage sampling circuit 4 and the detecting circuit 5.

Figure 9A:
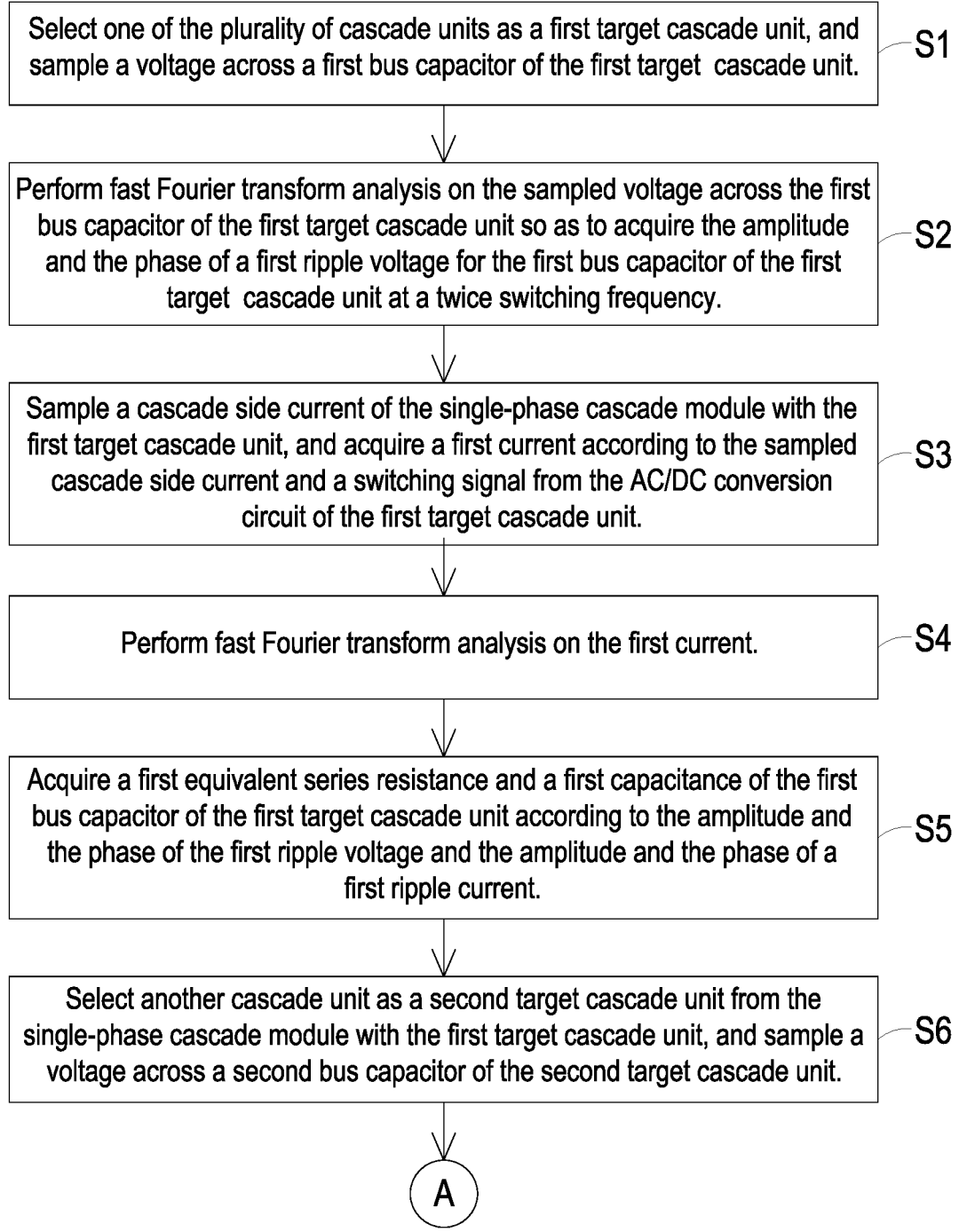
FIGS. 9A and 9B illustrate a flowchart of an online monitoring method for a cascade converter according to a fourth embodiment of the present disclosure.
Figure 9B:
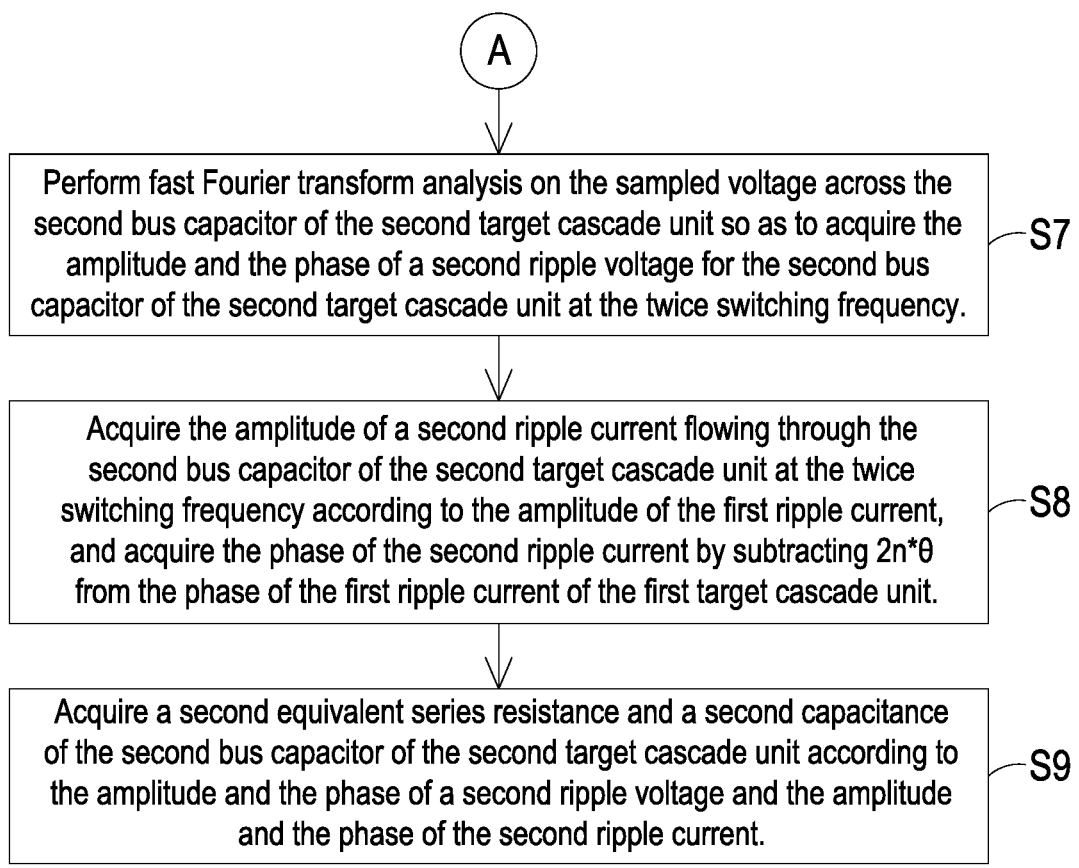

Certainly, besides the online monitoring method as described in FIGS. 8A and 8B, the equivalent series resistances ESR and the capacitances C of the other target cascade units may be acquired according to the method described in FIGS. 9A and 9B. Please refer to FIGS. 1, 2, 3, 4, 9A and 9B. FIGS. 9A and 9B illustrate a flowchart of an online monitoring method for a cascade converter according to a fourth embodiment of the present disclosure. In this embodiment, the cascade converter 1 is operated according to a carrier phase shifting modulation, the switching frequencies of all AC/DC conversion circuits 200 are identical, and the AC/DC conversion circuits 200 are H-bridge switching circuits.

Firstly, another cascade unit 20 is selected as a second target cascade unit B from the single-phase cascade module 2 with the first target cascade unit A. The impedance Xn(s) of the second bus capacitor $C_{bus}$ of the second target cascade unit B may be expressed by the following formula:

$$X_n(s) = \frac{\dot{U}_{dc\text{-}sfn}}{\dot{I}_{c\text{-}sfn}} = \frac{U_{dc\text{-}sfn} \angle \alpha_n}{I_{c\text{-}sfn} \angle \varphi_n} = \frac{1}{sC_n} + ESR_n \quad (d)$$

In the above mathematic formula, s is the parameter for Laplace transform, Cn is the capacitance of the second bus capacitor $C_{bus}$ of the second target cascade unit B, ESRn is an equivalent series resistance of the second bus capacitor $C_{bus}$ of the second target cascade unit B, $\dot{U}_{dc\text{-}sfn}$ is a voltage across two terminals of the second bus capacitor $C_{bus}$ of the second target cascade unit B at the frequency of $2f_s$, $U_{dc\text{-}sfn}$ is the amplitude of the voltage $\dot{U}_{dc\text{-}sfn}$, $\alpha_n$ is the phase of the voltage $\dot{U}_{dc\text{-}sfn}$, $\dot{I}_{c\text{-}sfn}$ is a current flowing through the second bus capacitor $C_{bus}$ of the second target cascade unit B at the frequency of $2f_s$, $I_{c\text{-}sfn}$ is the amplitude of the current $\dot{I}_{c\text{-}sfn}$, $\varphi_n$ is the phase of the current $\dot{I}_{c\text{-}sfn}$, and $f_s$ is a switching frequency of the AC/DC conversion circuit 200 of the first target cascade unit A (and the second target cascade unit B).

Please refer to FIGS. 1, 3 and 5. In this embodiment, the cascade converter 1 has a cascade connection topology. The AC currents flowing through all cascade units 20 of the single-phase cascade module 2 are the same. Moreover, the cascade converter 1 is operated according to a carrier phase shifting modulation. The carrier sequence difference n between the second target cascade unit B and the first target cascade unit A is a positive integer or a negative integer. In case that n is positive, the carrier of the second target cascade unit B lags the carrier of the first target cascade unit A. In case that n is negative, the carrier of the second target cascade unit B leads the carrier of the first target cascade unit A. Consequently, the instantaneous value $i_{c\text{-}sfn}$ of the second ripper current $\dot{I}_{c\text{-}sfn}$ flowing through the second bus capacitor $C_{bus}$ of the second target cascade unit B at the twice switching frequency may be expressed by the following formula:

$$i_{c\text{-}sfn} = \frac{4}{\pi} I_{sa} J(m_a \pi) \cos \varphi \cos(2\omega_c t - 2n\Delta\theta) \quad (e)$$

In the above mathematic formula, $I_{sa}$ is a peak value of the cascade side current $i_{sa}$, $m_a$ is a modulation ratio, J is a Bessel function, $\varphi$ is a power factor angle of the cascade side of the single-phase cascade module 2, $\omega_c$ is a carrier angular frequency, n is a carrier sequence difference between the second target cascade unit B and the first target cascade unit A, and $\Delta\theta$ is a phase difference between adjacent carriers.

As mentioned above, the phase of the ripple current $i_{c\text{-}sfn}$ for the second bus capacitor $C_{bus}$ of the second target cascade unit B (or any other target cascade unit) at the twice switching frequency is related to the phase of the carrier only. And the amplitude of the ripple current $i_{c\text{-}sfn}$ in each target unit is equal. In case that the ripple current $i_{c\text{-}sfn}$ of the bus capacitor $C_{bus}$ of one cascade unit 20 at the twice switching frequency is acquired, the ripple current of the bus capacitor $C_{bus}$ of any other cascade unit 20 at the twice switching frequency can be acquired. In other words, the ripple current of the bus capacitor $C_{bus}$ of any other cascade unit 20 (e.g., the second target cascade unit B) at the twice switching frequency can be acquired according to the ripple current $\dot{I}_{c\text{-}sf1}$ flowing through the first bus capacitor $C_{bus}$ of the first target cascade unit A at the twice switching frequency and the carrier phase difference.

In this embodiment, the online monitoring method includes steps S1~S9. The steps S1~S5 are the same as that of the first embodiment as shown in FIG. 6, and are not redundantly described herein. After the step S5, the step S6 is performed.

In the step S6, another cascade unit 20 is selected as a second target cascade unit B from the single-phase cascade module 2 with the first target cascade unit A, and a voltage across a second bus capacitor $C_{bus}$ of the second target cascade unit B is sampled. The carrier sequence difference n between the second target cascade unit B and the first target cascade unit A is a positive integer or a negative integer. In an embodiment, the voltage across the second bus capacitor $C_{bus}$ of the second target cascade unit B is sampled by the voltage sampling circuit 4.

In the step S7, fast Fourier transform analysis is performed on the sampled voltage across the second bus capacitor $C_{bus}$ of the second target cascade unit B. Consequently, the amplitude and the phase of a second ripple voltage for the second bus capacitor $C_{bus}$ of the second target cascade unit B at the twice switching frequency are acquired.

In the step S8, the amplitude of a second ripple current flowing through the second bus capacitor $C_{bus}$ of the second target cascade unit B at the twice switching frequency is acquired according to the amplitude of the first ripple current, and the phase of the second ripple current is acquired by subtracting $2n \times \Delta\theta$ from the phase of the first ripple current of the first target cascade unit A, wherein $\Delta\theta$ is a phase difference between the carriers of the H-bridge switching circuits of two adjacent cascade units, and n is carrier sequence difference between the second target cascade unit B and the first target cascade unit A.

In a step S9, a second equivalent series resistance and a second capacitance of the second bus capacitor $C_{bus}$ of the second target cascade unit B are acquired according to the amplitude and the phase of the second ripple voltage and the amplitude and the phase of the second ripple current.

In this embodiment, the detecting circuit 5 calculates the capacitance of the second bus capacitor $C_{bus}$ of the second target cascade unit B according to the sampled voltage across the second bus capacitor $C_{bus}$ of the second target cascade unit B, the amplitude of the first ripple current of the first target cascade unit A and the carrier phase difference between the second target cascade unit B and the first target cascade unit A.

In the embodiment of FIGS. 9A and 9B, the amplitude of the second ripple current flowing through the second bus capacitor $C_{bus}$ of the second target cascade unit B at the twice switching frequency is acquired according to the amplitude of the first ripple current, and the phase of the second ripple current is acquired by subtracting $2n \times \Delta\theta$ from the phase of the first ripple current of the first target cascade unit A. However, in the embodiment of FIGS. 8A and 8B, the second current is acquired according to the sampled cascade side current $i_{sa}$ sampled by the current sampling circuit 3 and the switching signal from the AC/DC conversion circuit 200 of the second target cascade unit B, and then fast Fourier transform analysis is performed on the second current. Consequently, the amplitude and the phase of the second ripple voltage flowing through the second bus capacitor $C_{bus}$ of the second target cascade unit B at the twice switching frequency are acquired. In comparison with the embodiment of FIGS. 8A and 8B, the online monitoring method as shown in FIGS. 9A and 9B is simpler.

From the above descriptions, the present disclosure provides a cascade converter and an online monitoring method for the cascade converter. The online monitoring method is capable of acquiring the capacitor parameters (include the equivalent series resistance and the capacitance) of the first bus capacitor of the first target cascade unit according to the result of sampling the voltage across the first bus capacitor of the first target cascade unit and the cascade side current corresponding to the single-phase cascade module and according to the amplitude and phase relationships of the ripple current flowing through the first bus capacitor of the first target cascade unit at the twice switching frequency. In such way, it is not necessary to increase the number of the current sensors. Since the capacitor parameters of the bus capacitor are monitored constantly, the aging degree of the bus capacitor can be checked at any time according to the first equivalent series resistance and the first capacitance. Since the malfunction caused by aging of the bus capacitor is prevented, the reliability of the cascade converter is enhanced.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An online monitoring method for a cascade converter, the cascade converter comprising at least one single-phase cascade module, each single-phase cascade module comprising a plurality of cascade units, each cascade unit comprising an AC/DC conversion circuit and a bus capacitor connected in series, AC sides of all AC/DC conversion circuits of each single-phase cascade module being connected in cascade to form a cascade side of the single-phase cascade module, the method comprising:
   selecting one of the plurality of cascade units as a first target cascade unit, the first target cascade unit having a first bus capacitor;
   sampling a voltage across the first bus capacitor to obtain a first sampling voltage;
   calculating an amplitude and a phase of a first ripple voltage across the first bus capacitor at a twice switching frequency according to the first sampling voltage;
   sampling a cascade side current of the single-phase cascade module corresponding to the first target cascade unit;
   calculating a first current according to the sampled cascade side current and a switching signal from the AC/DC conversion circuit of the first target cascade unit;
   calculating an amplitude and a phase of a first ripple current flowing through the first bus capacitor at the twice switching frequency according to the first current; and
   acquiring a first equivalent series resistance and a capacitance value of the first bus capacitor according to the amplitude and the phase of the first ripple voltage and the amplitude and the phase of the first ripple current.

2. The method according to claim 1, wherein the AC/DC conversion circuit is an H-bridge switching circuit, and the cascade converter works at a carrier phase shifting modulation.

3. The method according to claim 2, further comprising:
   selecting another cascade unit from the plurality of cascade units of the single-phase cascade module as a second target cascade unit, the second target cascade unit having a second bus capacitor;
   sampling a voltage across the second bus capacitor to obtain a second sampling voltage, wherein a carrier sequence difference n exists between the second target cascade unit and the first target cascade unit, n is a positive integer or a negative integer;
   calculating an amplitude and a phase of a second ripple voltage across the second bus capacitor at the twice switching frequency according to the second sampling voltage;
   acquiring an amplitude of a second ripple current flowing through the second bus capacitor at the twice switching frequency according to the amplitude of the first ripple current;
   acquiring a phase of the second ripple current by subtracting $2n \times \Delta\theta$ from the phase of the first ripple current, wherein $\Delta\theta$ is a phase difference between carriers of the H-bridge switching circuits of two adjacent cascade units; and
   acquiring a second equivalent series resistance and a capacitance value of the second bus capacitor according to the amplitude and the phase of the second ripple voltage and the amplitude and the phase of the second ripple current.

4. The method according to claim 1, further comprising:
   selecting another cascade unit from the plurality of cascade units of the single-phase cascade module as a second target cascade unit, the second target cascade unit having a second bus capacitor;
   sampling a voltage across the second bus capacitor to obtain a second sampling voltage;

calculating an amplitude and a phase of a second ripple voltage across the second bus capacitor at the twice switching frequency according to the second sampling voltage;

acquiring a second current according to the cascade side current and a switching signal from the AC/DC conversion circuit of the second target cascade unit;

calculating an amplitude and a phase of a second ripple current flowing through the second bus capacitor at the twice switching frequency according to the second current; and acquiring a second equivalent series resistance and a capacitance value of the second bus capacitor according to the amplitude and the phase of the second ripple voltage and the amplitude and the phase of the second ripple current.

5. The method according to claim 2, wherein the cascade converter works at a carrier phase shifting sine pulse width modulation.

6. The method according to claim 1, further comprising:
comparing the first equivalent series resistance with an initial equivalent series resistance of the first bus capacitor; and
comparing the capacitance value with an initial capacitance of the first bus capacitor so as to monitor whether the bus capacitor of the first target cascade unit is aged.

7. The method according to claim 1, wherein preceding to calculating the amplitude and the phase of the first ripple voltage, the method further comprising:
performing fast Fourier transform analysis on the first sampling voltage.

8. The method according to claim 1, wherein preceding to calculating the amplitude and the phase of the first ripple current, the method further comprising:
preforming fast Fourier transform analysis on the first current.

9. The method according to claim 1, wherein the bus capacitor of each cascade unit is an electrolytic capacitor.

10. A cascade converter, comprising:
a single-phase cascade module, wherein the single-phase cascade module comprises a plurality of cascade units, each cascade unit comprises an AC/DC conversion circuit and a bus capacitor connected in series, AC sides of all AC/DC conversion circuits of each single-phase cascade module are connected in cascade to form a cascade side of the single-phase cascade module, one of the plurality of cascade units of the single-phase cascade module is selected as a first target cascade unit, and the first target cascade unit having a first bus capacitor;
a current sampling circuit connected with the cascade side of the single-phase cascade module with the first target cascade unit, wherein a cascade side current of the single-phase cascade module is sampled by the current sampling circuit;
a voltage sampling circuit electrically connected with the first target cascade unit, wherein a voltage across the first bus capacitor is sampled by the voltage sampling circuit to obtain a first sampling voltage; and
a detecting circuit electrically connected with the current sampling circuit and the voltage sampling circuit, wherein the detecting circuit calculates a first equivalent series resistance and a capacitance value of the first bus capacitor according to the cascade side current, the first sampling voltage and a switching signal from the AC/DC conversion circuit of the first target cascade unit;

wherein another cascade unit is selected as a second target cascade unit from the single-phase cascade module with the first cascade unit, and the second target cascade unit has a second bus capacitor, wherein the voltage sampling circuit is electrically connected with the second target cascade unit, and a voltage across the second bus capacitor is sampled by the voltage sampling circuit to obtain a second sampling voltage, wherein the detecting circuit calculates a second equivalent series resistance and a capacitance value of the second bus capacitor according to the second sampling voltage, an amplitude of the first ripple current of the first target cascade unit and a carrier phase difference between the second target cascade unit and the first target cascade unit.

11. The cascade converter according to claim 10, wherein each cascade unit further comprises a rectifier circuit, and the rectifier circuit is connected with the bus capacitor in series.

12. The cascade converter according to claim 10, wherein the cascade converter works at a carrier phase shifting modulation, and the AC/DC conversion circuit is an H-bridge switching circuit.

13. The cascade converter according to claim 10, wherein the bus capacitor of each cascade unit is an electrolytic capacitor.

14. A cascade converter, comprising:
a single-phase cascade module, wherein the single-phase cascade module comprises a plurality of cascade units, each cascade unit comprises an AC/DC conversion circuit and a bus capacitor connected in series, AC sides of all AC/DC conversion circuits of each single-phase cascade module are connected in cascade to form a cascade side of the single-phase cascade module, one of the plurality of cascade units of the single-phase cascade module is selected as a first target cascade unit, and the first target cascade unit having a first bus capacitor;
a current sampling circuit connected with the cascade side of the single-phase cascade module with the first target cascade unit, wherein a cascade side current of the single-phase cascade module is sampled by the current sampling circuit;
a voltage sampling circuit electrically connected with the first target cascade unit, wherein a voltage across the first bus capacitor is sampled by the voltage sampling circuit to obtain a first sampling voltage; and
a detecting circuit electrically connected with the current sampling circuit and the voltage sampling circuit, wherein the detecting circuit calculates a first equivalent series resistance and a capacitance value of the first bus capacitor according to the cascade side current, the first sampling voltage and a switching signal from the AC/DC conversion circuit of the first target cascade unit;
wherein the first equivalent series resistance and the capacitance value of the first bus capacitor are calculated by an online monitoring method, and the method comprises:
calculating an amplitude and a phase of a first ripple voltage across the first bus capacitor at a twice switching frequency;
calculating a first current according to the sampled cascade side current and the switching signal from the AC/DC conversion circuit of the first target cascade unit;

calculating an amplitude and a phase of a first ripple current flowing through the first bus capacitor at the twice switching frequency; and acquiring the first equivalent series resistance and the capacitance value of the first bus capacitor according to the amplitude and the phase of the first ripple voltage and the amplitude and the phase of the first ripple current.

15. The cascade converter according to claim 14, wherein the cascade converter works at a carrier phase shifting modulation, and the AC/DC conversion circuit is an H-bridge switching circuit, wherein the method further comprises:

selecting another cascade unit as a second target cascade unit from the single-phase cascade module with the first target cascade unit, the second target cascade unit having a second bus capacitor, and sampling a voltage across the second bus capacitor to obtain a second sampling voltage, wherein a carrier sequence difference n exists between the second target cascade unit and the first target cascade unit, n is a positive integer or a negative integer;

calculating an amplitude and a phase of a second ripple voltage across the second bus capacitor at the twice switching frequency according to the second sampling voltage;

acquiring an amplitude of a second ripple current flowing through the second bus capacitor at the twice switching frequency according to the amplitude of the first ripple current;

acquiring a phase of the second ripple current by subtracting $2n \times \Delta\theta$ from the phase of the first ripple current, wherein $\Delta\theta$ is a phase difference between carriers of the H-bridge switching circuits of two adjacent cascade units; and acquiring a second equivalent series resistance and a capacitance value of the second bus capacitor according to the amplitude and the phase of the second ripple voltage and the amplitude and the phase of the second ripple current.

16. The cascade converter according to claim 14, wherein the online monitoring method further comprises:

selecting another cascade unit from the plurality of cascade units of the single-phase cascade module as a second target cascade unit, the second target cascade unit having a second bus capacitor, sampling a voltage across the second bus capacitor to obtain a second sampling voltage;

calculating an amplitude and a phase of a second ripple voltage across the second bus capacitor at the twice switching frequency;

acquiring a second current according to the cascade side current and a switching signal from the AC/DC conversion circuit of the second target cascade unit;

calculating an amplitude and a phase of a second ripple current flowing through the second bus capacitor at the twice switching frequency to obtain a second sampling voltage; and acquiring a second equivalent series resistance and a capacitance value of the second bus capacitor according to the amplitude and the phase of the second ripple voltage and the amplitude and the phase of the second ripple current.

17. The cascade converter according to claim 14, wherein preceding to calculating the amplitude and the phase of the first ripple voltage, the method further comprises:

performing fast Fourier transform analysis on the first sample voltage.

18. The cascade converter according to claim 14, wherein preceding to calculating the amplitude and the phase of the first ripple current, the method further comprises:

preforming fast Fourier transform analysis on the first current.

* * * * *